(12) United States Patent
Kim et al.

(10) Patent No.: US 9,755,503 B2
(45) Date of Patent: Sep. 5, 2017

(54) SEMICONDUCTOR DEVICE FOR CONTROLLING POWER-UP SEQUENCES

(71) Applicant: Samsung Electronics Co., Ltd., Suwon-si (KR)

(72) Inventors: Jong-cheol Kim, Suwon-si (KR); Seung-jun Bae, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/212,614

(22) Filed: Jul. 18, 2016

(65) Prior Publication Data
US 2017/0104406 A1    Apr. 13, 2017

(30) Foreign Application Priority Data

Oct. 8, 2015 (KR) ........................ 10-2015-0141643

(51) Int. Cl.
| | | |
|---|---|---|
| H03L 7/00 | (2006.01) | |
| H02M 1/36 | (2007.01) | |
| H01L 25/065 | (2006.01) | |
| G11C 5/14 | (2006.01) | |
| G11C 5/02 | (2006.01) | |

(52) U.S. Cl.
CPC ............ *H02M 1/36* (2013.01); *G11C 5/025* (2013.01); *G11C 5/148* (2013.01); *H01L 25/0657* (2013.01)

(58) Field of Classification Search
CPC .................................................... H02M 1/36
See application file for complete search history.

(56) References Cited

U.S. PATENT DOCUMENTS

| | | |
|---|---|---|
| 7,200,062 B2 | 4/2007 | Kinsely et al. |
| 7,505,349 B2 | 3/2009 | Hearn et al. |
| 7,746,719 B2 | 6/2010 | Kang |
| 8,296,704 B1 | 10/2012 | Kipper et al. |
| 8,427,224 B2 | 4/2013 | Lin et al. |
| 8,885,380 B2 | 11/2014 | Kang et al. |
| 2010/0164565 A1* | 7/2010 | Takeuchi ............ H03K 17/223 327/143 |
| 2011/0087835 A1 | 4/2011 | Sato et al. |
| 2012/0117409 A1 | 5/2012 | Lee et al. |
| 2013/0049828 A1 | 2/2013 | Kim et al. |
| 2014/0164812 A1 | 6/2014 | Alshinnawi et al. |

FOREIGN PATENT DOCUMENTS

KR   10-2012-0024026    3/2012

* cited by examiner

*Primary Examiner* — Daniel Puentes
(74) *Attorney, Agent, or Firm* — Muir Patent Law, PLLC

(57) ABSTRACT

A semiconductor device for controlling a power-up sequence is provided. The semiconductor device includes a plurality of chips. Each of the chips includes a power-up sequence controller configured to differently control generation sequences of internal source voltages. The power-up sequence controller changes the generation sequences of the internal source voltages in response to a power stabilization signal which is generated according to an external source voltage applied thereto in powering up the semiconductor device. Accordingly, a power-up current which is generated according to the internal source voltages being generated has a peak current distribution where a peak current may be equally distributed.

20 Claims, 11 Drawing Sheets

SEMICONDUCTOR DEVICE FOR CONTROLLING POWER-UP SEQUENCES

CROSS-REFERENCE TO RELATED APPLICATION

This application claims the benefit of priority under 35 U.S.C. §119 to Korean Patent Application No. 10-2015-0141643, filed on Oct. 8, 2015, in the Korean Intellectual Property Office, the disclosure of which is incorporated herein in its entirety by reference.

BACKGROUND

The present disclosure relates to a semiconductor device, and more particularly, to a semiconductor device for controlling a power-up sequence, which generates internal source voltages for reducing a peak current when powering up the semiconductor device.

Semiconductor devices are designed and manufactured for realizing high performance, high density, low cost, and a small size. Multi-chip package technology where a plurality of chips are integrated into a single package is being developed. The multi-chip package technology may be used in order for processors and memory chips, logic chips and memory chips, or memory chips to be integrated into a single package. If memory chips having the same type are integrated into a multi-chip package, a power-up peak current occurs in generating a certain internal source voltage because the generation sequences of internal source voltages are the same in powering up the memory chips. When the power-up peak current exceeds a threshold value, the multi-chip package is shut down by a power management integrated circuit (PMIC).

SUMMARY

The disclosed embodiments provide a semiconductor device for controlling a power-up sequence, which generates internal source voltages for reducing a peak current when powering up the semiconductor device.

The disclosed embodiments provide a multi-chip package for controlling a power-up sequence, which generates internal source voltages in order for a peak current of a power-up current to be equally distributed.

According to certain embodiments, the disclosure is directed to a semiconductor device comprising: a first chip comprising: a first voltage generator configured to generate a first plurality of internal source voltages including a first internal source voltage having a first voltage value, a second internal source voltage having a second voltage value, and a third internal source voltage having a third voltage value, wherein the first, second, and third voltage values are different from each other, and a first power-up sequence controller configured to control a first sequence of generating by the first voltage generator the first internal source voltage, the second internal source voltage, and the third internal source voltage; and a second chip comprising: a second voltage generator configured to generate a second plurality of internal source voltages including a fourth internal source voltage having the first voltage value, a fifth internal source voltage having the second voltage value, and a sixth internal source voltage having the third voltage value, and a second power-up sequence controller configured to control a second sequence of generating by the second voltage generator the fourth internal source voltage, the fifth internal source voltage, and the fifth internal source voltage, wherein the first sequence is different from the second sequence.

In some aspects, the disclosure further includes wherein the first power-up sequence controller comprises a first randomizer circuit configured to control the first sequence in response to a first power stabilization signal of the first chip, and wherein the second power-up sequence controller comprises a second randomizer circuit configured to control the second sequence in response to a second power stabilization signal of the second chip.

In some aspects, the disclosure further includes wherein the first power stabilization signal is generated based on an external source voltage supplied to the first chip, and wherein the second power stabilization signal is generated based on the external source voltage supplied to the second chip.

In some aspects, the disclosure further includes wherein the first power-up sequence controller further comprises a first multiplexer configured to selectively operate the first voltage generator in response to an output of the first randomizer circuit, and wherein the second power-up sequence controller further comprises a second multiplexer configured to selectively operate the second voltage generator in response to an output of the second randomizer circuit.

In some aspects, the disclosure further includes wherein the first sequence is changed when the semiconductor device is powered up, and wherein the second sequence is changed when the semiconductor device is powered up.

In some aspects, the disclosure further includes wherein the first power-up sequence controller comprises a first power-up sequence storage unit configured to store the first sequence, and wherein the second power-up sequence controller comprises a second power-up sequence storage unit configured to store the second sequence.

In some aspects, the disclosure further includes wherein the first power-up sequence storage unit comprises a first anti-fuse array including a plurality of first anti-fuses, and the plurality of first anti-fuses are programmed with the first internal source voltage, the second internal source voltage, and the third internal source voltage according to the first sequence, and wherein the second power-up sequence storage unit comprises a second anti-fuse array including a plurality of second anti-fuses, and the plurality of second anti-fuses are programmed with the fourth internal source voltage, the fifth internal source voltage, and the sixth internal source voltage according to the second sequence.

In some aspects, the disclosure further includes wherein the first power-up sequence controller comprises a first control logic configured to control the first sequence based on power-up sequence information input through a plurality of pads included in the semiconductor device, and wherein the second power-up sequence controller comprises a second control logic configured to control the second sequence based on power-up sequence information input through the plurality of pads.

In some aspects, the disclosure further includes wherein signals of the semiconductor device are not input or output through the plurality of pads.

In some aspects, the disclosure further includes wherein the semiconductor device is a multi-chip package including the plurality of chips which are stacked and are electrically connected to each other through a plurality of through electrodes.

In some aspects, the disclosure further includes wherein the semiconductor device is a memory module including a plurality of memory chips mounted on a printed circuit board.

In some aspects, the disclosure further includes wherein the first power-up voltage generator comprises a first power-up voltage generation circuit configured to generate the first internal source voltage, a second power-up voltage generation circuit configured to generate the second internal source voltage, and a third power-up voltage generation circuit configured to generate the third internal source voltage, and wherein the second power-up voltage generator comprises a fourth power-up voltage generation circuit configured to generate the fourth internal source voltage, a fifth power-up voltage generation circuit configured to generate the fifth internal source voltage, and a sixth power-up voltage generation circuit configured to generate the sixth internal source voltage.

According to certain embodiments, the disclosure is directed to a multi-chip package comprising: a first memory chip comprising: a first voltage generator configured to generate a first plurality of internal source voltages having first values, the first values including a first internal source voltage value, a second internal source voltage value, and a third internal source voltage value; and a first power-up sequence controller configured to control a generation sequence of the first plurality of internal source voltages generated by the first voltage generator; a second memory chip comprising: a second voltage generator configured to generate a second plurality of internal source voltages having second values, the second values including the first internal source voltage value, the second internal source voltage value, and the third internal source voltage value, and a second power-up sequence controller configured to control a generation sequence of the second plurality of internal source voltages generated by the second voltage generator, wherein the first, second, and third internal source voltage values are different from each other, and wherein the first power-up sequence controller sets the generation sequence of the first plurality of internal source voltages different from the generation sequence of the second plurality of internal source voltages equally distributing a peak current of a power-up current in powering up the multi-chip package.

In some aspects, the disclosure further includes wherein the first power-up sequence controller changes the generation sequence of the first plurality of internal source voltages in response to a power stabilization signal, which is generated according to an external source voltage, and wherein the second power-up sequence controller changes the generation sequence of the second plurality of internal source voltages in response to the power stabilization signal, wherein the power stabilization signal is applied to the first and second memory chips.

In some aspects, the disclosure further includes wherein the first power-up sequence controller stores the generation sequence of the first internal source voltages, and wherein the second power-up sequence controller stores the generation sequence of the second internal source voltages.

In some aspects, the disclosure further includes wherein the first power-up sequence controller determines the generation sequence of the first internal source voltages based on power-up sequence information input through a first plurality of pads included in the first memory chip, and wherein the second power-up sequence controller determines the generation sequence of the second internal source voltages based on power-up sequence information input through a second plurality of pads included in the second memory chip.

In some aspects, the disclosure further includes wherein the first power-up voltage generator comprises a first power-up voltage generation circuit configured to generate a first internal source voltage having the first internal source voltage value, a second power-up voltage generation circuit configured to generate a second internal source voltage having the second internal source voltage value, and a third power-up voltage generation circuit configured to generate a third internal source voltage having the third internal source voltage value, and wherein the second power-up voltage generator comprises a fourth power-up voltage generation circuit configured to generate a fourth internal source voltage having the fourth internal source voltage value, a fifth power-up voltage generation circuit configured to generate a fifth internal source voltage having the fifth internal source voltage value, and a sixth power-up voltage generation circuit configured to generate a sixth internal source voltage having the sixth internal source voltage value.

According to certain embodiments, the disclosure is directed to a method for controlling a power-up sequence of a semi-conductor device, the method comprising: generating, by a first power-up sequence controller of a first memory chip, a first operational sequence for operation of a first plurality of voltage generation circuits; transmitting the first operational sequence from the first power-up sequence controller to the first plurality of voltage generation circuits; generating, by a second power-up sequence controller of a second memory chip, a second operational sequence for operation of a second plurality of voltage generation circuits; transmitting the second operational sequence from the second power-up sequence controller to the second plurality of voltage generation circuits; and generating at power-up, by each of the first and second pluralities of voltage generation circuits, power-up voltages according to the first and second operational sequences.

In some aspects, the disclosure further includes wherein the generating at power-up, by each of the first and second pluralities of voltage generation circuits, the power-up voltages further comprising: operating the first plurality of voltage generation circuits to generate a first internal source voltage having a first voltage value, a second internal source voltage having a second voltage value, and a third internal source voltage having a third voltage value, wherein the first, second, and third voltage values are different from each other, and operating the first plurality of voltage generation circuits to generate a fourth internal source voltage having the first voltage value, a fifth internal source voltage having the second voltage value, and a sixth internal source voltage having the third voltage value.

In some aspects, the disclosure further includes wherein the operating the first and second pluralities of voltage generation circuits further includes: operating the first and second pluralities of voltage generation circuits using an external source voltage.

BRIEF DESCRIPTION OF THE DRAWINGS

The disclosed embodiments will be more clearly understood from the following detailed description taken in conjunction with the accompanying drawings in which.

DETAILED DESCRIPTION OF THE EMBODIMENTS

Figure 1:
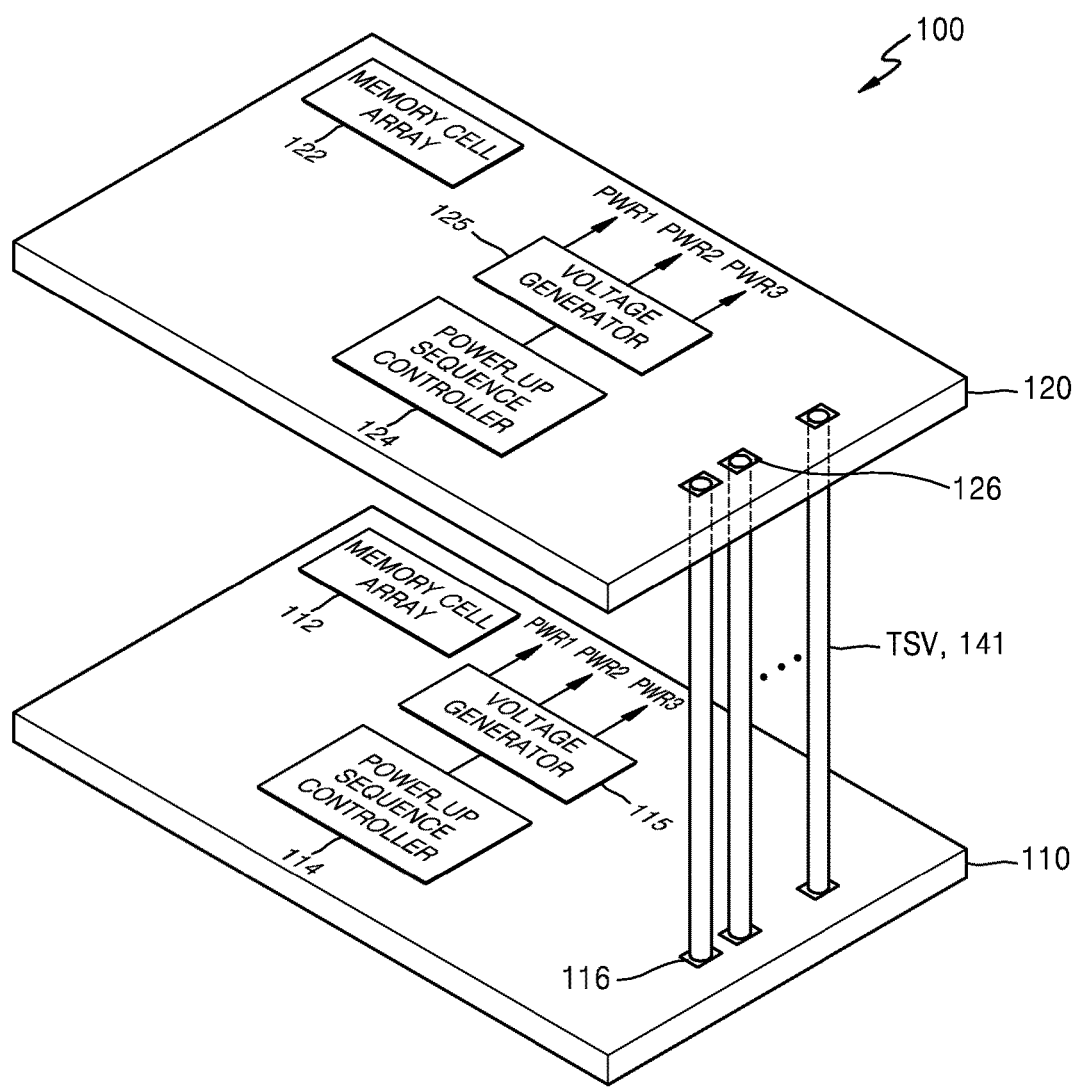
FIG. 1 is a diagram for describing a semiconductor device including a power-up sequence controller according to certain exemplary embodiments.

Advantages and features and methods of accomplishing the same may be understood more readily by reference to the following detailed description of certain embodiments and the accompanying drawings. The present disclosure concept may, however, be embodied in many different forms and should not be construed as being limited to the embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the relative sizes and thicknesses of layers and regions are exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole.

It will be understood that when an element or layer is referred to as being "on," "connected to," "electrically connected to," or "coupled to" another element or layer, it can be directly on, connected to, electrically connected to, or coupled to another element or layer or intervening elements or layers may be present. In contrast, when an element is referred to as being "directly on," "directly connected to," "directly electrically connected to," or "directly coupled to" another element or layer, or as contacting or in contact with another element or layer, there are no intervening elements or layers present. Other words used to describe the relationship between elements or layers should be interpreted in a like fashion (e.g., "between" versus "directly between," "adjacent" versus "directly adjacent," "on" versus "directly on").

It will be understood that, although the terms first, second, etc. may be used herein to describe various elements, these elements should not be limited by these terms. Unless the text indicates otherwise, these terms are only used to distinguish one element from another element. For example, for example, a first element, a first component or a first section discussed below could be termed a second element, a second component or a second section without departing from the teachings of the present disclosure.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to limit the scope of the example embodiments.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

As used herein, the term "and/or" includes any and all combinations of one or more of the associated listed items. Expressions such as "at least one of" when preceding a list of elements, modify the entire list of elements and do not modify the individual elements of the list.

Hereinafter, example embodiments will be described in detail with reference to the accompanying drawings. However, this does not limit the concepts to specific embodiments and it should be understood that the concepts covers all the modifications, equivalents, and replacements within the idea and technical scope of the disclosed embodiments. Like reference numerals refer to like elements throughout. In the drawings, the dimensions and size of each structure are exaggerated, reduced, or schematically illustrated for convenience in description and clarity.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The semiconductor devices described herein may be a semiconductor memory chip or semiconductor logic chip, a stack of such chips, a semiconductor package including a package substrate and one or more semiconductor chips, or a package-on-package device. In the case of memory, the semiconductor device may be part of a volatile or non-volatile memory. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In semiconductor devices, a high-capacity dynamic random access memory (DRAM) may be implemented with a multi-chip package including a plurality of memory dies or memory layers. The multi-chip package may be a semiconductor package which is implemented as one package by stacking a plurality of semiconductor chips or various kinds of semiconductor chips. The DRAM may further include a logic die which is electrically connected to a plurality of stacked memory dies. The logic die may perform a signal distribution function of receiving a command, an address, a clock, and data from a memory controller and supplying the received command, address, clock, and data to the memory dies. The logic die may interface the memory controller and may buffer the command, the address, the clock, and the data, thereby operating as a memory buffer between the memory controller and the memory dies. The logic die may transmit or receive signals to or from the memory dies through a plurality of through silicon vias (TSVs).

FIG. 1 is a diagram for describing a semiconductor device 100 including a power-up sequence controller according to an exemplary embodiment. The power-up sequence controller may be implemented with a control circuit.

Referring to FIG. 1, the semiconductor device 100 may be configured with a multi-chip package which includes a first die 110 and a second die 120. The first die 110 and the second die 120 may be implemented in the same type and may each be referred to as a memory die which includes a plurality of memory cell arrays 112 and 122.

The first die 110 may include a memory cell array 112, a power-up sequence controller 114, which may be implemented with a control circuit (and may be described as a control circuit 114) and a voltage generator 115. The memory cell array 112 may include a plurality of memory cells which are arranged in columns and in rows. Each of the memory cells may include one access transistor and one storage capacitor. The memory cells may have an arrangement structure where the memory cells intersect each other at intersection points of a matrix including a plurality of word lines and a plurality of bit lines. For example, a memory cell may be located at each intersection of the plurality of word lines and one of the plurality of bit lines. Data supplied from a memory controller may be written in the memory cells of the memory cell array 112.

According to an exemplary embodiment, the memory cell array 112 may be implemented as a three-dimensional (3D) memory array. For example, the 3D memory array may include a circuit to operate memory cells and an active region disposed on a silicon substrate, and may be configured in a monolithic type on a physical level of at least one of memory cell arrays each including a circuit which is provided on or in the substrate. The monolithic type may refer to embodiments in which layers of levels configuring an array are stacked just on layers of lower levels of the array.

U.S. Pat. Nos. 7,679,133, 8,553,466, 8,654,587 and 8,559,235 and U.S. Patent Application No. 2011/0233648 disclose appropriate elements of a 3D memory array, which include a plurality of levels, and in which word lines and/or bit lines are shared between the plurality of levels. The content of each of U.S. Pat. No. 7,679,133, U.S. Pat. No. 8,553,466, U.S. Pat. No. 8,654,587, U.S. Pat. No. 8,559,235, and U.S. Patent Application No. 2011/0233648 is incorporated herein by reference in its entirety.

The power-up sequence controller 114 may control the generation sequences of internal source voltages PWR1 to PWR3 (i.e., PWR1, PWR2, and PWR3) used by the first die 110. In some embodiments, the power-up sequence controller 114 may control the generation sequences of the internal source voltages PWR1 to PWR3 in response to a first power stabilization signal which is generated based on a level of an external source voltage supplied to the first die 110.

According to an exemplary embodiment, the power-up sequence controller 114 may previously store the generation sequences of the internal source voltages PWR1 to PWR3 of the first die 110. According to another exemplary embodiment, the power-up sequence controller 114 may control the generation sequences of the internal source voltages PWR1 to PWR3 based on power-up sequence information input to electrode pads 116 of the first die 110.

The second die 120 may be connected to the first die 110 through a plurality of through electrodes 141. The through electrodes 141 may be connected between the electrode pads 116 of the first die 110 and electrode pads 126 of the second die 120, thereby providing an electrical connection. The through electrodes 141 may be through substrate vias (TSVs), such as through-silicon vias and may be configured to transmit and/or receive signals to/from the first die 110 and the second die 120.

The second die 120 may include a memory cell array 122, a power-up sequence controller 124, which may be implemented with a control circuit (and may be described as a control circuit 124), and a voltage generator 125. Like the memory cell array 112 of the first die 110, the memory cell array 122 may include a plurality of memory cells, which are arranged in columns and in rows, and may be implemented as a 3D memory array.

The power-up sequence controller 124 may control the generation sequences of internal source voltages PWR1 to PWR3 used by the second die 120. The power-up sequence controller 124 may control the generation sequences of the internal source voltages PWR1 to PWR3 in response to a second power stabilization signal which is generated based on a level of an external source voltage supplied to the second die 120. According to an exemplary embodiment, the power-up sequence controller 124 may previously store the generation sequences of the internal source voltages PWR1 to PWR3 of the second die 120. According to another exemplary embodiment, the power-up sequence controller 124 may control the generation sequences of the internal source voltages PWR1 to PWR3, based on power-up sequence information input to electrode pads 126 of the second die 120.

Figure 2:
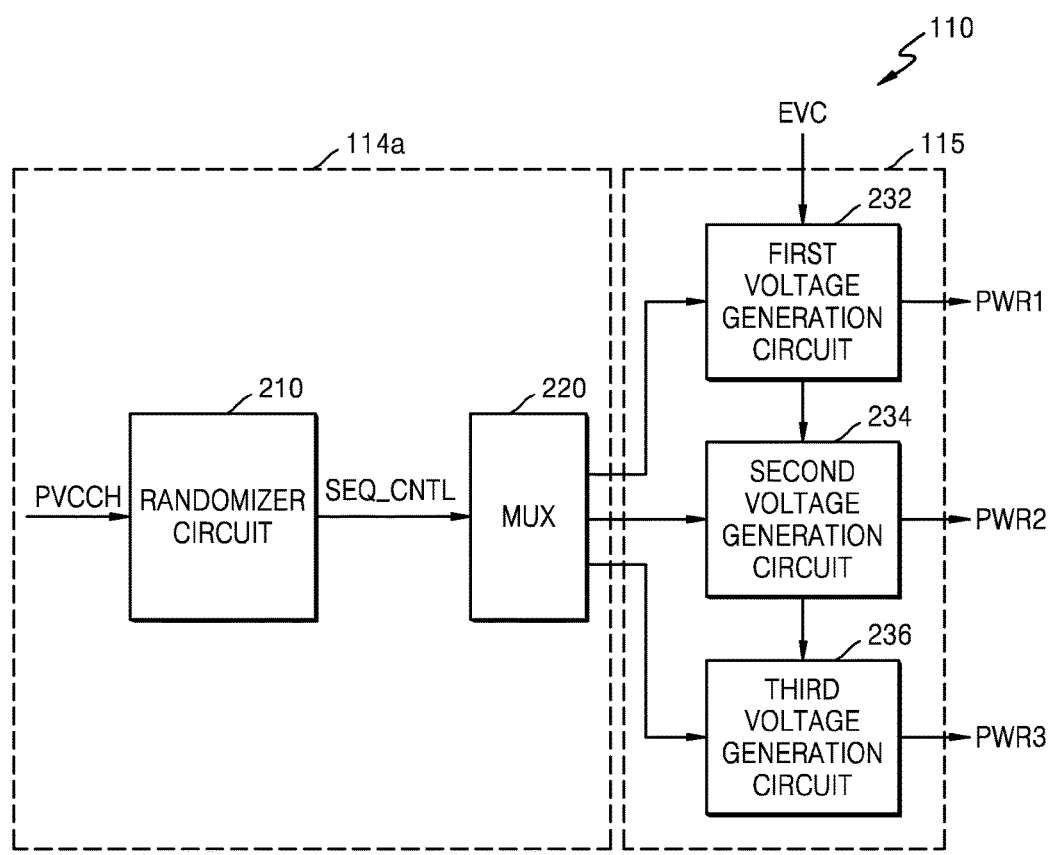
FIG. 2 is a diagram for describing a portion of a first die including a power-up sequence controller according to certain exemplary embodiments.

FIG. 2 is a diagram for describing a portion of a first die 110 including a power-up sequence controller according to an exemplary embodiment. In some embodiments, a power-up sequence controller 114a included in the first die 110 may be configured similarly to the power-up sequence controller 124 of the second die 120 of FIG. 1, and an internal voltage generator 115 included in the first die 110 may be configured similarly to an internal voltage generator 125 included in a second die 120. In certain embodiments, a power-up sequence controller 114a included in the first die 110 may be configured identically to the power-up sequence controller 124 of the second die 120 of FIG. 1, and an internal voltage generator 115 included in the first die 110 may be configured identically to an internal voltage generator 125 included in a second die 120.

Referring to FIG. 2, the first die 110 may include the power-up sequence control 114a and an internal voltage generator 115 which includes first to third voltage generation circuits 232, 234 and 236. According to an exemplary embodiment, the internal voltage generator 115 may include various voltage generation circuits in addition to three the voltage generation circuits.

The power-up sequence controller 114a may include a randomizer circuit 210, including a first power stabilization signal PVCCH received by the randomizer circuit 210, and a multiplexer (mux) 220. The first power stabilization signal PVCCH may be a signal which is generated when an external source voltage EVC applied to the first die 110 is equal to or higher than a certain voltage level. For example, the first power stabilization signal PVCCH may be a signal which is generated based on the external source voltage EVC and then, when a level of the signal becomes equal to or higher than a certain voltage level, is shifted to a logic low level. When a level of the first power stabilization signal PVCCH becomes a logic low level, this denotes that a level of the external source voltage EVC applied to the first die 110 is stable.

The randomizer circuit 210 may monitor the first power stabilization signal PVCCH, and may generate a sequence control signal SEQ_CNTL based on a state of the first power stabilization signal PVCCH. The sequence control signal SEQ_CNTL may be transmitted from the randomizer circuit 210 to the multiplexer 220. The state of the first power stabilization signal PVCCH may be determined based on a voltage level of the first power stabilization signal PVCCH and a shift time when the first power stabilization signal PVCCH is shifted to a logic low level. The sequence control signal SEQ_CNTL may be supplied to the multiplexer 220, and may be supplied to the internal voltage generator 115 through the multiplexer 220.

The internal voltage generator 115 may be controlled by the power-up sequence controller 114a and may generate first to third internal source voltages PWR1 to PWR3 to operate the first die 110. The internal voltage generator 115 may include the first voltage generation circuit 232 that generates the first internal source voltage PWR1 using the external source voltage EVC, the second voltage generation circuit 234 that generates the second internal source voltage PWR2 using the external source voltage EVC, and the third voltage generation circuit 236 that generates the third internal source voltage PWR3 using the external source voltage EVC.

In some embodiments, the first to third internal source voltages PWR1 to PWR3 may each have a voltage level higher than that of the external source voltage EVC. In other embodiments, the first to third internal source voltages PWR1 to PWR3 may each have a voltage level lower than or equal to that of the external source voltage EVC.

The internal voltage generator 115 may determine the operation sequences of the first to third voltage generation circuits 232, 234 and 236 in response to the sequence control signal SEQ_CNTL. For example, the internal voltage generator 115 may operate the first to third voltage generation circuits 232, 234 and 236 in the sequence of the first voltage generation circuit 232, the second voltage generation circuit 234, and the third voltage generation circuit 236 to generate the first to third internal source voltages PWR1 to PWR3 in the sequence of the first internal source voltage PWR1, the second internal source voltage PWR2, and the third internal source voltage PWR3.

As another example, in response to the sequence control signal SEQ_CNTL, the internal voltage generator 115 may operate the first to third voltage generation circuits 232, 234 and 236 in the sequence of the second voltage generation circuit 234, the third voltage generation circuit 236, and the first voltage generation circuit 232 to generate the first to third internal source voltages PWR1 to PWR3 in the sequence of the second internal source voltage PWR2, the third internal source voltage PWR3, and the first internal source voltage PWR1.

As another example, in response to the sequence control signal SEQ_CNTL, the internal voltage generator 115 may operate the first to third voltage generation circuits 232, 234 and 236 in the sequence of the third voltage generation circuit 236, the first voltage generation circuit 232, and the second voltage generation circuit 234 to generate the first to third internal source voltages PWR1 to PWR3 in the sequence of the third internal source voltage PWR3, the first internal source voltage PWR1, and the third internal source voltage PWR3.

As another example, in response to the sequence control signal SEQ_CNTL, the internal voltage generator 115 may operate the first to third voltage generation circuits 232, 234 and 236 in the sequence of the second voltage generation circuit 234, the first voltage generation circuit 232, and the third voltage generation circuit 236 to generate the first to third internal source voltages PWR1 to PWR3 in the sequence of the second internal source voltage PWR2, the first internal source voltage PWR1, and the third internal source voltage PWR3.

As the above examples illustrate, the internal voltage generator 115 may operate the first to third voltage generation circuits 232, 234 and 236 and their corresponding first to third internal source voltages PWR1 to PWR3 in any order, both random and sequential.

In the present embodiment, since the power-up sequence controller 114a determines the operation sequences of the first to third voltage generation circuits 232, 234 and 236 in response to the first power stabilization signal PVCCH which is generated in powering up the first die 110, the first to third internal source voltages PWR1 to PWR3 of the first die 110 may be generated in a different sequence each time a power-up operation is performed. In some embodiments, the first to third internal source voltages PWR1 to PWR3 of the first die 110 may be generated in a random sequence each time a power-up operation is performed.

The second die 120 of FIG. 1, which is implemented in the same type as that of the first die 110, may include a power-up sequence controller 124 which includes a randomizer circuit 210 and a multiplexer 220, similar to the power-up sequence controller 114a of FIG. 2. In the second die 120, the power-up sequence controller 124 responding to a second power stabilization signal PVCCH, which is generated in a power-up operation, may generate the sequence control signal SEQ_CNTL to determine the operation sequences of the first to third internal source voltages PWR1 to PWR3. The first to third internal source voltages PWR1 to PWR3 of the second die 120 may be generated in a different sequence each time a power-up operation is performed. In some embodiments, the first to third internal source voltages PWR1 to PWR3 of the second die 120 may be generated in a random sequence each time a power-up operation is performed.

Figure 3:
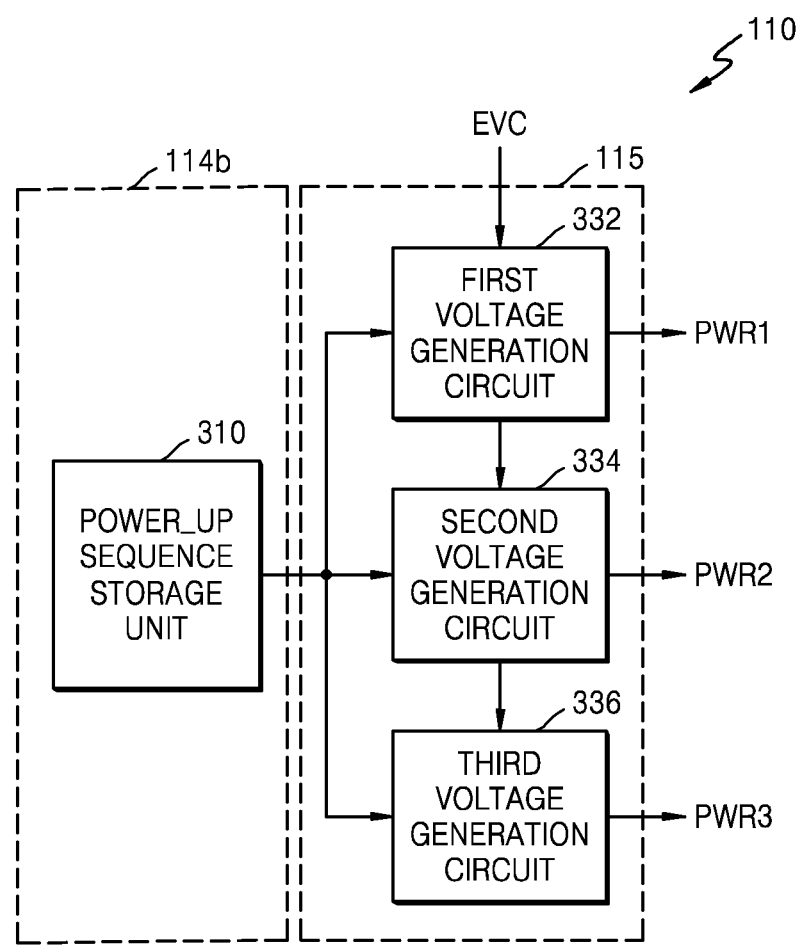
FIG. 3 is a diagram for describing a portion of a first die including a power-up sequence controller according to certain exemplary embodiments.

FIG. 3 is a diagram for describing a portion of a first die 110 including a power-up sequence controller 114b according to an embodiment. The power-up sequence controller 114b of the first die 110 may be configured similarly to the power-up sequence controller 124 of the second die 120 of FIG. 1.

Referring to FIG. 3, the first die 110 may include the power-up sequence control 114b and an internal voltage generator 115 which includes first to third voltage generation circuits 332, 334 and 336. According to an embodiment, the power-up sequence controller 114b may include a power-up sequence storage unit 310 that stores the operation sequences of the first to third voltage generation circuits 332, 334 and 336. The power-up sequence storage unit 310 may be a circuit configured to store different sequences.

The internal voltage generator 115 may be controlled by the power-up sequence controller 114b and may generate first to third internal source voltages PWR1 to PWR3. The internal voltage generator 115 may include the first voltage generation circuit 332 that generates the first internal source voltage PWR1 using an external source voltage EVC, the second voltage generation circuit 334 that generates the second internal source voltage PWR2 using the external source voltage EVC, and the third voltage generation circuit 336 that generates the third internal source voltage PWR3 using the external source voltage EVC.

The internal voltage generator 115 may generate the first to third internal source voltages PWR1 to PWR3, based on the operation sequences of the first to third voltage generation circuits 332, 334 and 336 stored in the power-up sequence storage unit 310. Similarly to the internal voltage generator 115 of FIG. 2, the internal voltage generator 115 of FIG. 2 may operate the first to third voltage generation circuits 332, 334 and 336 and their corresponding first to third internal source voltages PWR1 to PWR3 in any order. However, rather than the orders being randomly selected, according to FIG. 3, the orders can be pre-stored in a sequence storage unit 310.

Figure 4:
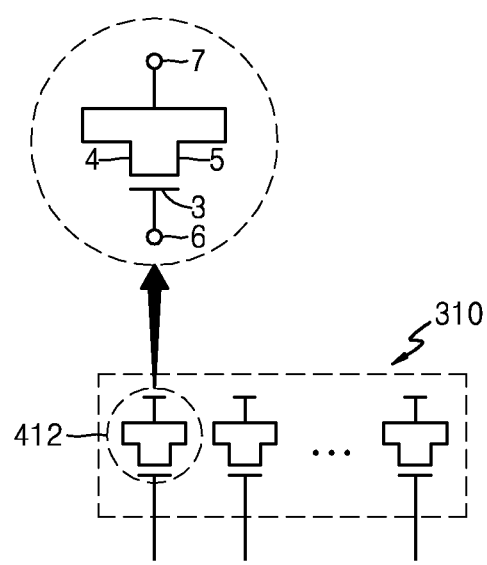
FIG. 4 is a diagram for describing a power-up sequence storage unit of FIG. 3.

FIG. 4 is a diagram for describing an exemplary power-up sequence storage unit 310 of FIG. 3, according to some embodiments.

Referring to FIG. 4, the power-up sequence storage unit 310 may be configured with an anti-fuse array including a plurality of anti-fuses 412. The anti-fuses 412 may have electrical characteristic opposite to that of a fuse element and may be a resistive fuse element that has a high resistance value in an unprogrammed state and a low resistance value in a programmed state. For example, anti-fuses 412 may be configured to create an electrically-conductive path when the first power stabilization signal PVCCH value becomes equal to or higher than a certain voltage level.

The anti-fuses 412 may each be configured such that a dielectric is inserted between both of two conductors of each of the anti-fuses 412. The anti-fuses 412 may be programmed by breaking down the dielectric between the two conductors with a high voltage which is applied through the two conductors of each of the anti-fuses 412. As a result of the program, both conductors of each of the anti-fuses 412 may be short-circuited, and thus, the anti-fuses 412 may each have a low resistance value.

The anti-fuses 412 may each include a depletion-type MOS transistor including a source 4 and a drain 5 which are connected to each other. In an initial state, a resistance between a first node 6 connected to a gate 3 and a second node 7 connected to the source 4 and the drain 5 may have a very high value because the first node 6 is isolated from the second node 7 by gate oxide. Therefore, the first node 6 may be electrically disconnected from the second node 7. For example, an electrically disconnected state may be set to a logic low level corresponding to an unprogrammed state.

Each of the anti-fuses 412 may apply a breakdown voltage to the first node 6 and the second node 7 to break down the gate oxide, and thus may irreversibly change from an electrically disconnected state to an electrically connected state. When the gate oxide is broken down, a resistance between the first node 6 and the second node 7 may be lowered. This state may be set to a logic high level corresponding to a programmed state. For example, the anti-fuses 412 may be configured to create an electrically-conductive path when the first power stabilization signal PVCCH value becomes equal to or higher than a certain voltage level.

The power-up sequence storage unit 310 of the first die 110 may selectively program the anti-fuses 412 to store the operation sequences of the first to third voltage generation circuits 332, 334 and 336. For example, power-up sequence storage unit 310 may store an operation sequence corresponding to the sequence of the first voltage generation circuit 332, the second voltage generation circuit 334, and the third voltage generation circuit 336. Therefore, in some embodiments, the internal voltage generator 115 may operate the first to third voltage generation circuits 332, 334 and 336 in the sequence of the first voltage generation circuit 332, the second voltage generation circuit 334, and the third voltage generation circuit 336 to generate the first to third internal source voltages PWR1 to PWR3 in the sequence of the first internal source voltage PWR1, the second internal source voltage PWR2, and the third internal source voltage PWR3.

The second die 120 of FIG. 1, which in some embodiments is implemented in the same type as that of the first die 110, may include a power-up sequence controller 124 including the power-up sequence storage unit 310 of FIG. 4, which may be similar to the power-up sequence controller 114a of FIG. 4. The second die 120 may generate the first to third internal source voltages PWR1 to PWR3 in a power-up operation, based on the operation sequences of the first to third voltage generation circuits 332, 334 and 336 stored in the power-up sequence controller 124.

In some embodiments, the power-up sequence controller 124 of the second die 120 may control the power-up sequence storage unit 310 to program the anti-fuses 412 in order for the first to third internal source voltages PWR1 to PWR3 to be generated in an operation sequence different from that of the first to third voltage generation circuits 332, 334 and 336 stored in the power-up sequence controller 124 of the first die 110. For example, the power-up sequence storage unit 310 of the second die 120 may store an operation sequence corresponding to the sequence of the second voltage generation circuit 334, the third voltage generation circuit 336, and the first voltage generation circuit 332, and thus, the first to third internal source voltages PWR1 to PWR3 may be generated in the sequence of the second internal source voltage PWR2, the third internal source voltage PWR3, and the first internal source voltage PWR1.

Figure 5:
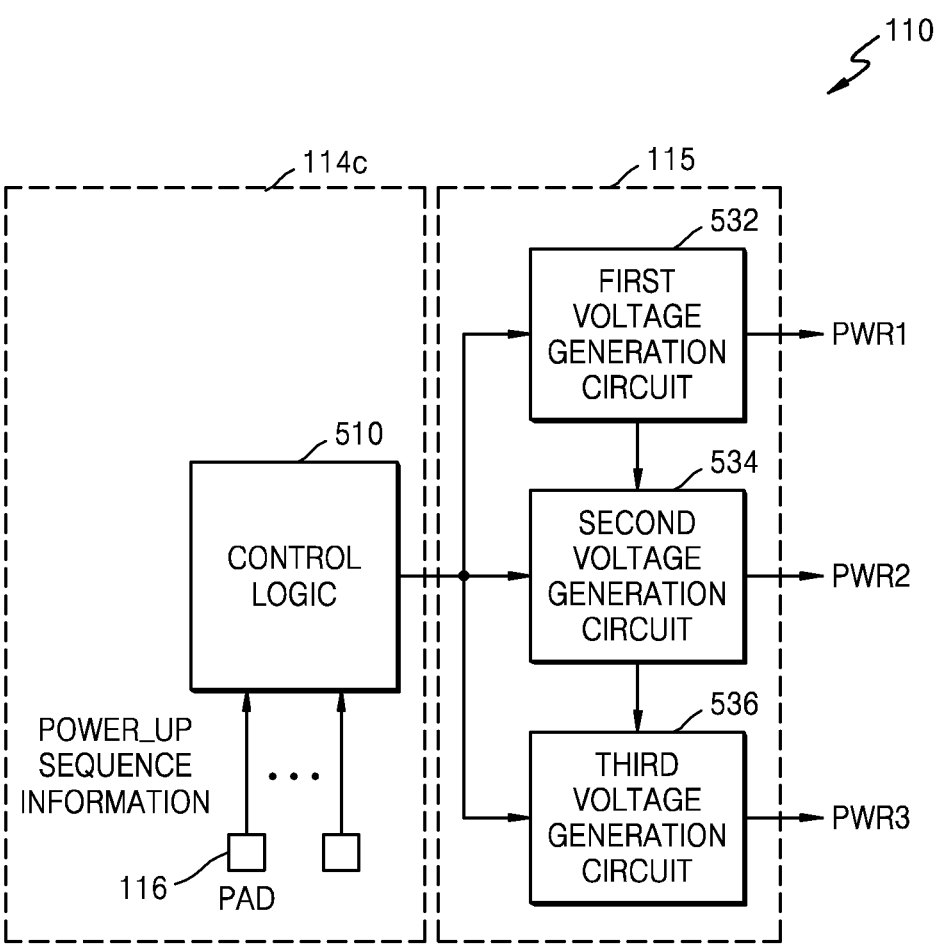
FIG. 5 is a diagram for describing a portion of a first die including a power-up sequence controller according to certain exemplary embodiments.

FIG. 5 is a diagram for describing a portion of a first die 110 including a power-up sequence controller 114c according to an exemplary embodiment. The power-up sequence controller 114c of the first die 110 may be configured similarly to the power-up sequence controller 124 of the second die 120 of FIG. 1.

Referring to FIG. 5, the first die 110 may include the power-up sequence control 114c and an internal voltage generator 115, which includes first to third voltage generation circuits 532, 534 and 536.

The power-up sequence controller 114c may include a control logic 510 that receives power-up sequence information input through electrode pads 116 of the first die 110 to determine the operation sequences of the first to third voltage generation circuits 532, 534 and 536. The control logic 510 may decode the power-up sequence information to determine the operation sequences of the first to third voltage generation circuits 532, 534 and 536. The electrode pads 116 through which the power-up sequence information is received may be pads through which signals used for an operation (for example, a read or write operation) of the first die 110 are not input or output. For example, in some embodiments, the electrode pads 116 may transmit only information related to the power-up sequence and may be dedicated for power-up sequence information.

The internal voltage generator 115 may be controlled by the power-up sequence controller 114c and may generate first to third internal source voltages PWR1 to PWR3. The internal voltage generator 115 may include the first voltage generation circuit 532 that generates the first internal source voltage PWR1 using the external source voltage EVC, the second voltage generation circuit 534 that generates the second internal source voltage PWR2 using the external source voltage EVC, and the third voltage generation circuit 536 that generates the third internal source voltage PWR3 using the external source voltage EVC.

The internal voltage generator 115 may generate the first to third internal source voltages PWR1 to PWR3 according to the operation sequences of the first to third voltage generation circuits 532, 534 and 536, which are determined based on power-up sequence information obtained through decoding by the control logic 510.

The second die 120 of FIG. 1, which is implemented in the same type as that of the first die 110, may include a power-up sequence controller 124 that decodes power-up sequence information input through electrode pads 126 of the second die 120 to determine the operation sequences of the first to third voltage generation circuits 532, 534 and 536 similarly to the power-up sequence controller 114c. The electrode pads 126 of the second die 120 may be disposed not to be connected to the electrode pads 116 of the first die 110 through a plurality of through electrodes 141 so that power-up sequence information supplied to the power-up sequence controller 114c of the first die 110 is set to be different from power-up sequence information supplied to the power-up sequence controller 124 of the second die 120. In some embodiments, the plurality of through electrodes 141 may be connected to the electrode pads 116 of the first die 110, and be disconnected from the electrode pads 126 of the second die 120.

For example, the power-up sequence information supplied to the first die 110 may be set so that the first to third voltage generation circuits 232, 234 and 236 operate in the sequence of the first voltage generation circuit 232, the second voltage generation circuit 234, and the third voltage generation circuit 236 to generate the first to third internal source voltages PWR1 to PWR3 in the sequence of the first internal source voltage PWR1, the second internal source voltage PWR2, and the third internal source voltage PWR3. On the other hand, the power-up sequence information supplied to the second die 120 may be set so that the first to third voltage generation circuits 232, 234 and 236 operate in the sequence of the second voltage generation circuit 234, the third voltage generation circuit 236, and the first voltage generation circuit 232 to generate the first to third internal source voltages PWR1 to PWR3 in the sequence of the second internal source voltage PWR2, the third internal source voltage PWR3, and the first internal source voltage PWR1.

Figure 6:
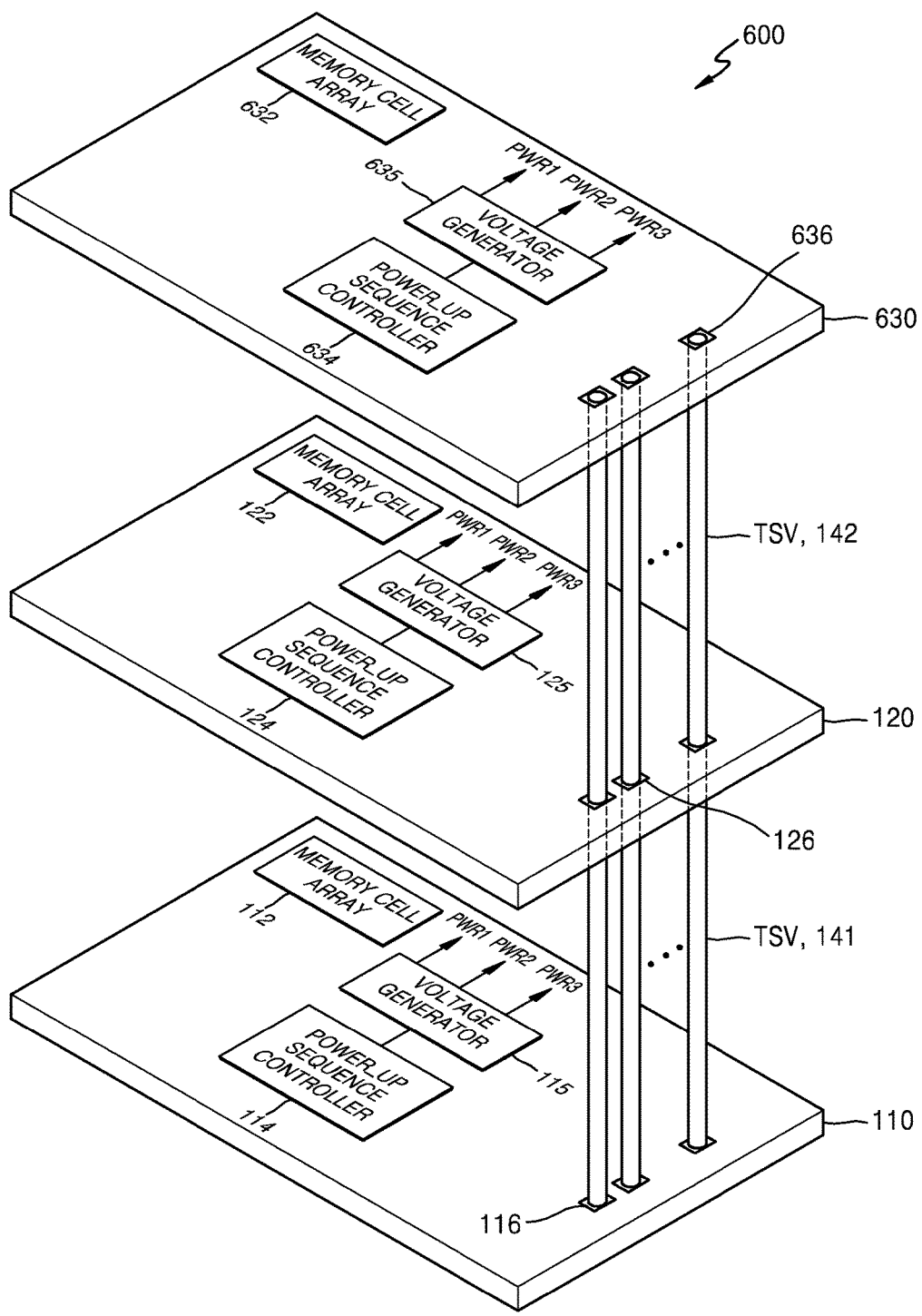
FIGS. 6 and 7 are diagrams for describing a semiconductor device including a power-up sequence controller according to certain exemplary embodiments.
Figure 7:
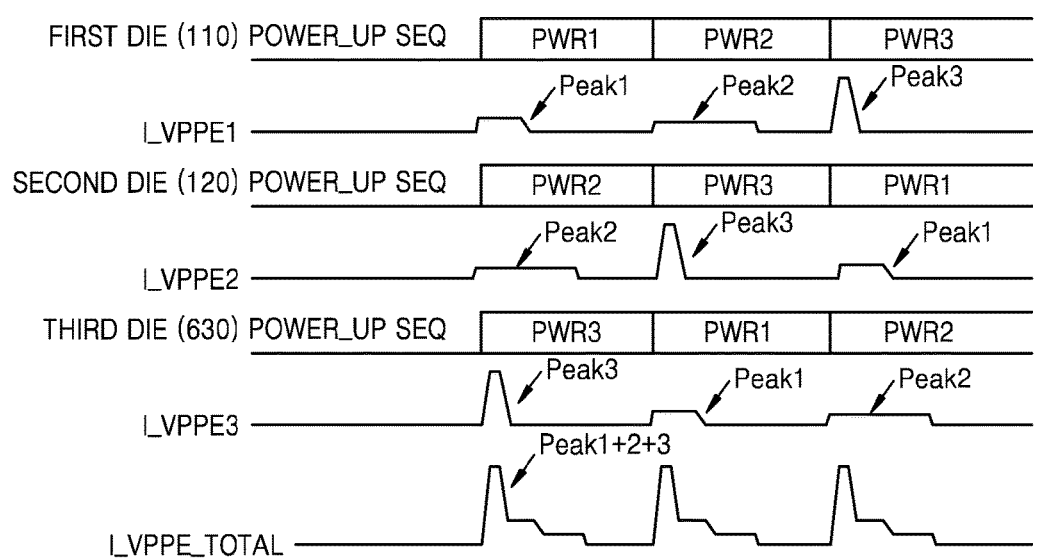

FIGS. 6 and 7 are diagrams for describing a semiconductor device 600 including a power-up sequence controller according to an exemplary embodiment.

Referring to FIG. 6, the semiconductor device 600 may be different from the semiconductor device 100 of FIG. 1 in that the semiconductor device 600 further includes a third die 630 stacked on a second die 120. With the exception of this additional third die 630, the semiconductor device 600 is substantially the same as the semiconductor device 100 of FIG. 1. Accordingly, the structures corresponding to the above-described embodiments are not referred to by reference numeral or are referred to by like reference numerals.

As illustrated in FIG. 6, the semiconductor device 600 may include a first die 110 including a memory cell array 112, a power-up sequence controller 114, and a voltage generator 115, a second die 120 including a memory cell array 122, a power-up sequence controller 124, and a voltage generator 125, and a third die 630 including a memory cell array 632, a power-up sequence controller 634, and a voltage generator 635.

A first die 110 may control the generation sequences of first to third internal source voltages PWR1 to PWR3 of the first die 110 according to the control of a first power-up sequence controller 114 in a power-up operation of the semiconductor device 600. The first die 110 may be connected to the second die 120 through a plurality of through electrodes 141.

The second die 120 may control the generation sequences of first to third internal source voltages PWR1 to PWR3 of the second die 120 according to the control of a second power-up sequence controller 124 in a power-up operation of the semiconductor device 600. The second die 120 may be connected to a third die 330 through a plurality of through electrodes 142. The through electrodes 142 may be TSVs, and may be configured to transmit and/or receive signals to/from the second die 120 and the third die 630.

The third die 630 may be implemented in the same type as that of the first and second dies 110 and 120 and may include a memory cell array 632 and a power-up sequence controller 634. Similarly to first and second memory cell arrays 112 and 122 of the first and second dies 110 and 120, the third memory cell array 632 may include a plurality of memory cells which are arranged in columns and in rows, and may be implemented as a 3D memory array.

The third power-up sequence controller 634 may control the generation sequences of first to third internal source voltages PWR1 to PWR3 used by the third die 630. Similarly to the power-up sequence controller 114*a* of FIG. 2, the third power-up sequence controller 634 may include a randomizer circuit that generates a sequence control signal in response to a third power stabilization signal generated based on an external source voltage applied to the third die 630, and may determine the generation sequences of the first to third internal source voltages PWR1 to PWR3 of the third die 630 according to the sequence control signal.

Similarly to the power-up sequence controller 114*b* of FIG. 3, the third power-up sequence controller 634 may include a power-up sequence storage unit that stores the generation sequences of the first to third internal source voltages PWR1 to PWR3 of the third die 630. Similarly to the power-up sequence controller 114*c* of FIG. 5, the third power-up sequence controller 634 may determine the generation sequences of the first to third internal source voltages PWR1 to PWR3 of the third die 630 using a control logic that decodes power-up sequence information input through a plurality of electrode pads 636. The plurality of electrode pads 636 may be similar to the pluralities of electrode pads 116 and 126.

Exemplarily, when the first power-up sequence controller 114 of the first die 110 generates the first to third internal source voltages PWR1 to PWR3 in the sequence of the first internal source voltage PWR1, the second internal source voltage PWR2, and the third internal source voltage PWR3, as illustrated in FIG. 7, a peak current of a power-up current I_VPPE1 of the first die 110 may be shown in the sequence of Peak1, Peak2, and Peak3. When the second power-up sequence controller 124 of the second die 120 generates the first to third internal source voltages PWR1 to PWR3 in the sequence of the second internal source voltage PWR2, the third internal source voltage PWR3, and the first internal source voltage PWR1, a peak current of a power-up current I_VPPE2 of the second die 120 may be shown in the sequence of Peak2, Peak3, and Peak1. When the third power-up sequence controller 634 of the third die 630 generates the first to third internal source voltages PWR1 to PWR3 in the sequence of the third internal source voltage PWR3, the first internal source voltage PWR1, and the second internal source voltage PWR2, a peak current of a power-up current I_VPPE3 of the third die 630 may be shown in the sequence of Peak3, Peak1, and Peak2, and a total power-up current I_VPPE_TOTAL of the semiconductor device 600 may be shown.

The total power-up current I_VPPE_TOTAL of the semiconductor device 600 may be equal to a sum of the power-up current I_VPPE1 of the first die 110, the power-up current I_VPPE2 of the second die 120, and the power-up current I_VPPE3 of the third die 630. Therefore, in the total power-up current I_VPPE_TOTAL, a peak current "Peak1+Peak2+Peak3" may be equally distributed. In some embodiments, the total power-up current may be equally distributed in time (e.g., because of the sequential application of power) and space (e.g., across the first, second, and third dies 110, 120, and 630). The peak current "Peak1+Peak2+Peak3" may be set to be lower than a power-up peak current which is set in a PMIC connected to the semiconductor device 600. Therefore, the semiconductor device 600 prevents shutdown from occurring due to an excessive power-up peak current in a power-up operation.

Figure 8:
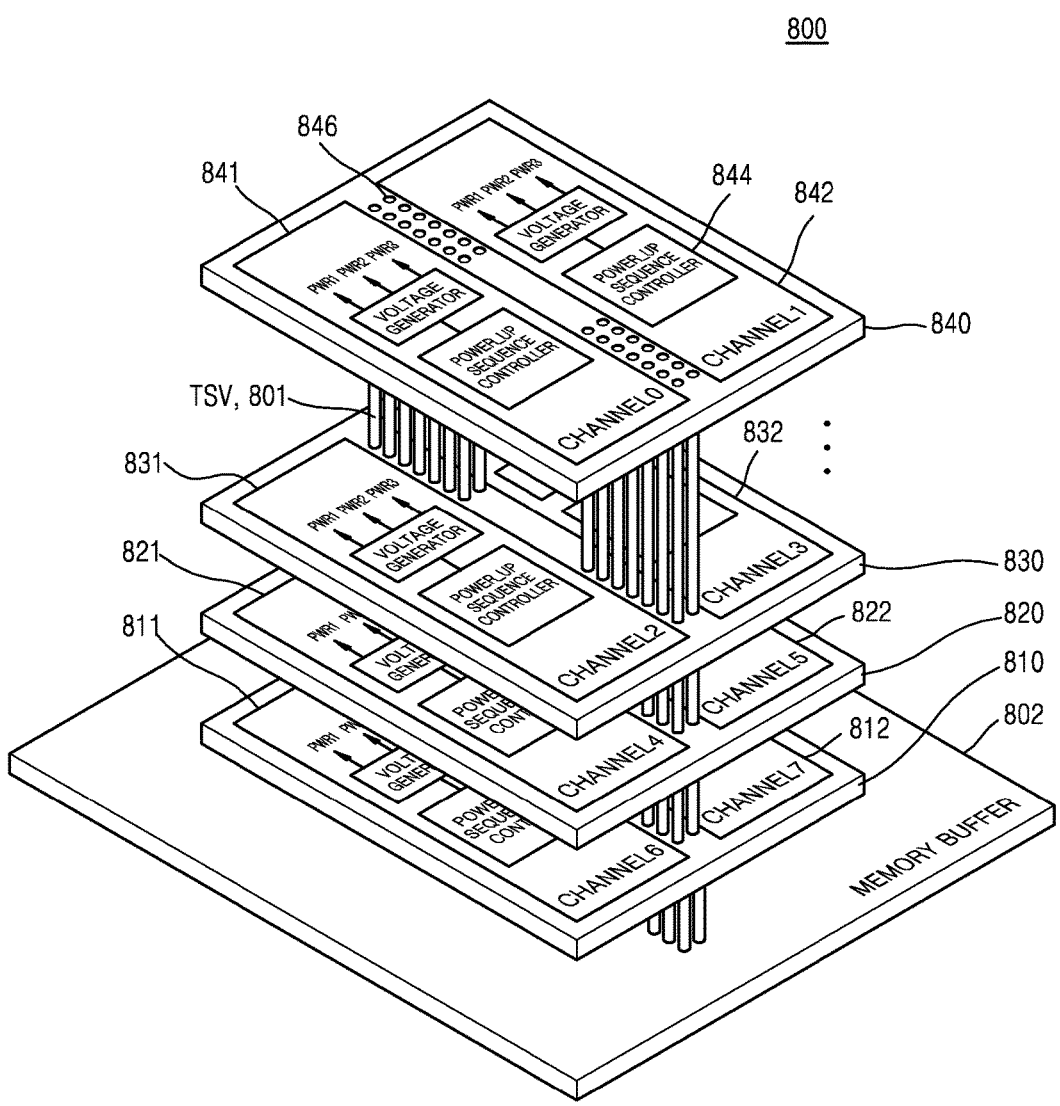
FIG. 8 is a diagram for describing a semiconductor device where memory layers including a power-up sequence controller according to certain exemplary embodiments are stacked.

FIG. 8 is a diagram for describing a semiconductor device 800 where memory layers including a power-up sequence controller according to an embodiment are stacked.

Referring to FIG. 8, the semiconductor device 800 may include a plurality of memory layers 810 to 840 (i.e., memory layer 810, memory layer 820, memory layer 830, and memory layer 840), which are stacked above one another. The memory layers 810 to 840 may configure a plurality of independent interfaces referred to as channels. The memory layer 810 may be configured with two channels 811 and 812 (i.e., Channel6 and Channel7), the memory layer 820 may be configured with two channels 821 and 822 (i.e., Channel4 and Channel5), the memory layer 830 may be configured with two channels 831 and 832 (i.e., Channel2 and Channel3), and the memory layer 840 may be configured with two channels 841 and 842 (i.e., Channel0 and Channel1). Each of the channels 811, 812, 821, 822, 831, 832, 841 and 842 may include a plurality of independent memory banks and may be independently clocked. As shown in FIG. 8, each of the channels 811, 812, 821, 822, 831, 832, 841 and 842 may include a power-up sequence controller and a voltage generator.

In the present embodiment, disclosed is an example where the semiconductor device 800 is configured with eight channels by stacking four the memory layers 810 to 840, each memory layer having two channels. According to an embodiment, in the semiconductor device 800, two to eight memory layers may be stacked. Each of the memory layers 810 to 840 may be configured with one or four channels. In some embodiments, a single channel may be distributed to the plurality of memory layers 810 to 840.

The semiconductor device 800 may further include a memory buffer 802 disposed under the stacked memory layers 810 to 840. The memory buffer 802 may provide a signal distribution function, including receiving command, address, clock, and data signal information from a memory controller, and supplying the received command, address, clock, and data signal information to the memory layers 810 to 840. The memory buffer 802 may buffer all of the command, the address, the clock, and the data signal information, and thus, the memory controller may drive only a load of the memory buffer 802, thereby interfacing with the memory layers 810 to 840.

The memory buffer 802 may transmit and/or receive a signal to and/or from the memory layers 810 to 840 through a through substrate via (TSV) 801, which may be a through silicon via. Although not illustrated, the memory buffer 802 may communicate with an external memory controller through a conductive means disposed on an outer surface of the semiconductor device 800.

Each of the channels 811, 812, 821, 822, 831, 832, 841 and 842 may be configured to provide an independent command and data interface. Each of the channels 811, 812, 821, 822, 831, 832, 841 and 842 may be independent from each other. Thus, for conciseness of description, a single channel (e.g., channel 842) will be described as a representative example. A description of the one channel 842 may be identically applied to the other channels 811, 812, 821, 822, 831, 832 and 841.

A single channel 842 may include a power-up sequence controller 844 that controls the generation sequences of internal source voltages used by the first channel 842. Similarly to the power-up sequence controller 114a of FIG. 2, the power-up sequence controller 844 may include a randomizer circuit that generates a sequence control signal in response to a power stabilization signal generated based on an external source voltage applied to the single channel 842, and may determine the generation sequences of first to third internal source voltages PWR1 to PWR3 of the single channel 842 according to the sequence control signal.

Similarly to the power-up sequence controller 114b of FIG. 3, the power-up sequence controller 844 may include a power-up sequence storage unit that stores the generation sequences of the first to third internal source voltages PWR1 to PWR3 of the single channel 842. Similarly to the power-up sequence controller 114c of FIG. 5, the power-up sequence controller 844 may determine the generation sequences of the first to third internal source voltages PWR1 to PWR3 of the single channel 842 by using a control logic that decodes power-up sequence information input through a plurality of electrode pads 846 of memory layer 840 connected to a plurality of through electrodes 801.

In powering up the semiconductor device 800, the power-up sequence controller of each of the channels 811, 812, 821, 822, 831, 832, 841 and 842 may control generation sequences so that the generation sequences of first to third internal source voltages PWR1 to PWR3 of each of the channels 811, 812, 821, 822, 831, 832, 841 and 842 differ from those of others of the other channels. Therefore, a peak current of a total power-up current of the semiconductor device 800 which is obtained by summating all power-up currents of the channels 811, 812, 821, 822, 831, 832, 841 and 842 may be equally distributed. In some embodiments, the total power-up current may be equally distributed in time (e.g., because of the sequential application of power) and space (e.g., across each of the channels 811, 812, 821, 822, 831, 832, 841 and 842).

Figure 9:
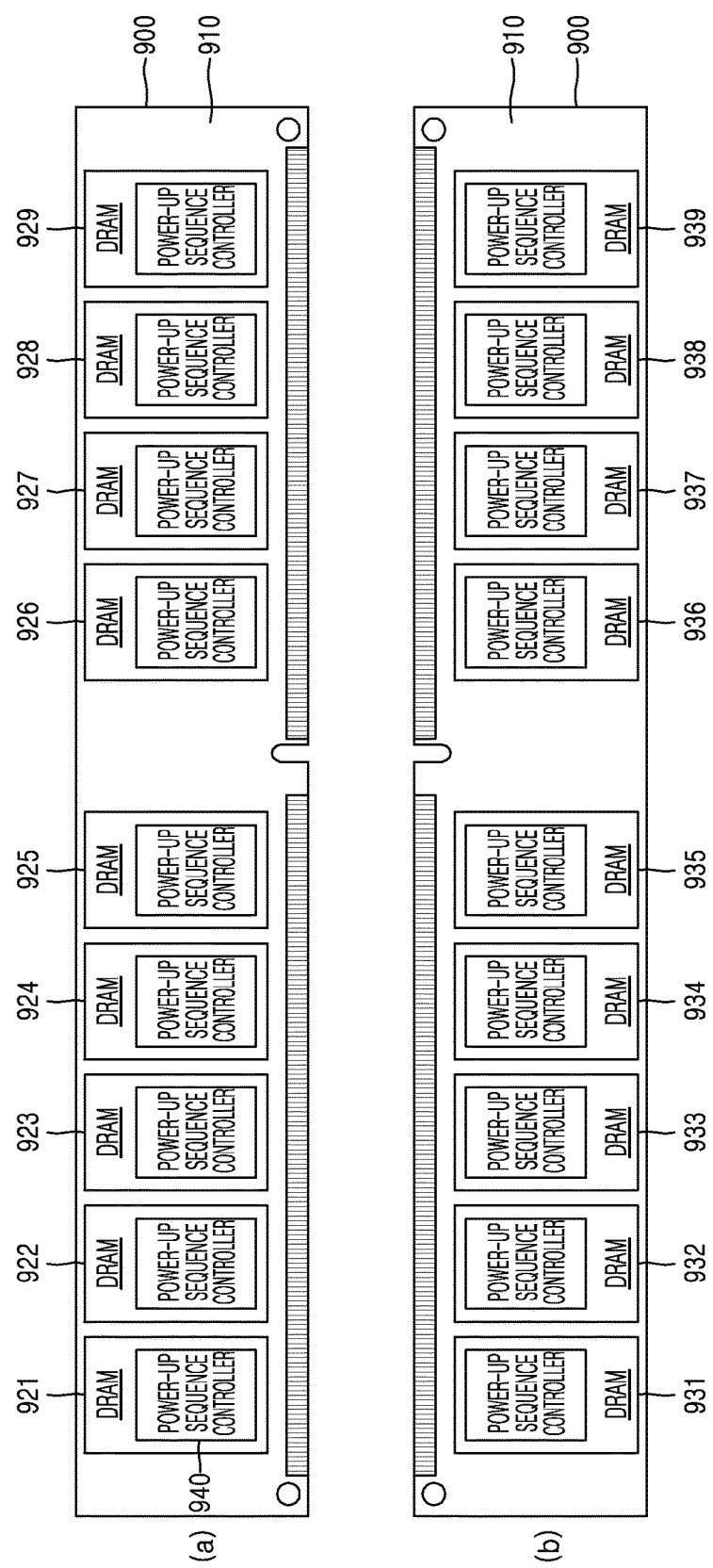
FIG. 9 is a diagram for describing a memory module equipped with memory chips including a power-up sequence controller according to certain exemplary embodiments.

FIG. 9 is a diagram for describing a memory module 900 equipped with memory chips including a power-up sequence controller according to an embodiment.

Referring to FIG. 9, the memory module 900 may include a plurality of memory chips 921 to 929 (i.e., 921, 922, 923, 924, 925, 926, 927, 928, and 929) and 931 to 939 (i.e., 931, 932, 933, 934, 935, 936, 937, 938, and 939) mounted on a surface layer (an uppermost or lowermost layer) of a printed circuit board (PCB) 910. The number of the memory chips 921 to 929 and 931 to 939 may be determined based on a structure and an input/output (I/O) configuration of the memory module 900. For example, in a 1-rank load reduced in-line memory module (LR-DIMM) having an I/O×72 configuration, nine memory chips 921 to 929 having an I/O×8 configuration may be mounted on a first surface of the memory module 900, and nine memory chips 931 to 939 may be mounted on a second surface.

The memory chips 921 to 929 mounted on the first surface (e.g., surface (a)) may be respectively connected to the memory chips 931 to 939 mounted on the second surface (e.g., surface (b)) through a through via hole (TVH) or a blind via hole (BVH) of the PCB 910. Such a structure may be used for increasing a memory capacity of the memory module 900. According to an embodiment, in the memory module 900, nine memory chips may be mounted on each of the first and second surfaces.

Each of the memory chips 921 to 929 and 931 to 939 may include a power-up sequence controller, such as, for example, power-up sequence controller 940, that controls the generation sequences of internal source voltages used by a corresponding memory chip. Similarly to the power-up sequence controller 114a of FIG. 2, the power-up sequence controller 940 may include a randomizer circuit that generates a sequence control signal in response to a power stabilization signal generated based on an external source voltage applied to the memory chips 921 to 929 and 931 to 939, and may determine the generation sequences of first to third internal source voltages PWR1 to PWR3 of a corresponding memory chip according to the sequence control signal.

Similarly to the power-up sequence controller 114b of FIG. 3, the power-up sequence controller 940 may include a power-up sequence storage unit that stores first to third internal source voltages PWR1 to PWR3 of a corresponding memory chip. Similarly to the power-up sequence controller 114c of FIG. 5, the power-up sequence controller 940 may determine the generation sequences of the first to third internal source voltages PWR1 to PWR3 of a corresponding memory chip by using a control logic that decodes power-up sequence information input through a plurality of pads.

In powering up the memory module 900, the power-up sequence controller 940 of each of the memory chips 921 to 929 and 931 to 939 may control generation sequences so that the generation sequences of first to third internal source voltages PWR1 to PWR3 of a corresponding memory chip differ from those of others of the other memory chips. Therefore, a peak current of a total power-up current of the semiconductor device 800 which is obtained by summating all power-up currents of the memory chips 921 to 929 and 931 to 939 may be equally distributed. In some embodiments, the total power-up current may be equally distributed in time (e.g., because of the sequential application of power) and space (e.g., across each of the memory chips 921 to 929 and 931 to 939).

Figure 10:
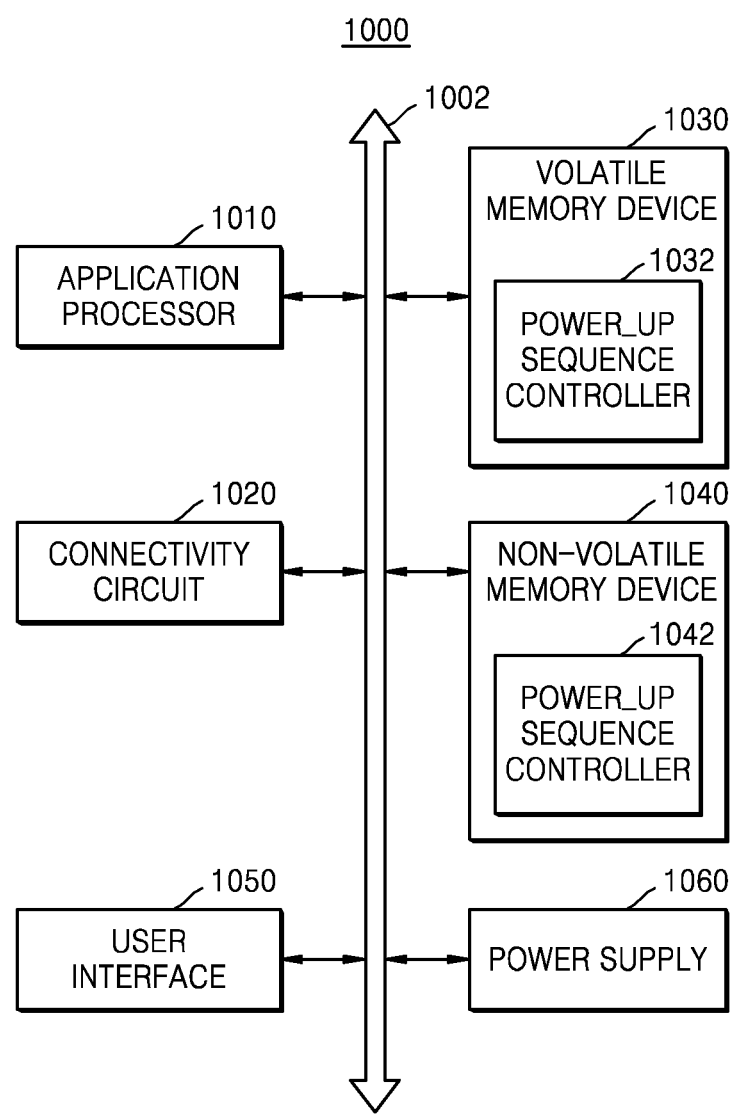
FIG. 10 is a block diagram illustrating an example where a memory device including a power-up sequence controller according to certain exemplary embodiments is applied to a mobile system.

FIG. 10 is a block diagram illustrating an example where a memory device including a power-up sequence controller according to embodiments is applied to a mobile system 1000.

Referring to FIG. 10, the mobile system 1000 may include an application processor 1010, a connectivity circuit 1020, a first memory device 1030, a second memory device 1040, a user interface 1050, and a power supply 1060. The first memory device 1030 may be implemented with a volatile memory device, and the second memory device 1040 may be implemented as a nonvolatile memory device.

According to an embodiment, the mobile system 1000 may be any type of mobile system, such as, for example, a mobile phone, a smartphone, a personal digital assistant (PDA), a portable multimedia player (PMP), a digital camera, a music player, a portable game console, a navigation system, or the like.

The application processor 1010 may execute applications for providing Internet browsers, games, videos, and/or the like. According to an embodiment, the application processor 1010 may include one processor core or a plurality of processor cores. For example, the application processor 1010 may include a dual-core, a quid-core, and a hexa-core. Also, according to an embodiment, the application processor 1010 may further include a cache memory disposed inside or outside the application processor 1010.

The connectivity circuit 1020 may be a transceiver circuit that performs wired and/or wireless communication with an external device. For example, the connectivity circuit 1020 may perform Ethernet communication, near field communication (NFC), radio frequency identification (RFID) communication, mobile telecommunication, memory card communication, universal serial bus (USB) communication, and/or the like. For example, the connectivity unit 1020 may include a baseband chipset and may support communication such as GSM, GRPS, WCDMA, HSxPA, and/or the like.

The first memory device 1030 may be a nonvolatile memory device that stores, as write data, data obtained through processing by the application processor 1010 or may operate as a working memory. The first memory device 1030 may include a power-up sequence controller 1032 that controls the generation sequences of internal source voltages used by the first memory device 1030. The power-up sequence controller 1032 may perform control so that a peak current of a power-up current, which is generated according to the internal source voltages generated in powering up the first memory device 1030, is equally distributed.

The second memory device 1040 may be a nonvolatile memory device that stores a boot image for booting the mobile system 1000. For example, the nonvolatile memory device 1040 may be implemented with electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAIVI), ferroelectric random access memory (FRAM), or a memory similar thereto.

The second memory device 1040 may include a power-up sequence controller 1042 that controls the generation sequences of internal source voltages used by the second memory device 1040. The power-up sequence controller 1042 may perform control so that a peak current of a power-up current which is generated according to the internal source voltages generated in powering up the second memory device 1040 is equally distributed.

The user interface 1050 may include one or more input devices, such as a keypad, a touch screen, etc., or one or more output devices such as a speaker, a display device, etc. The user interface 1050 may supply an operation voltage of the power supply 1060. Also, according to an embodiment, the mobile system 1000 may further include a camera image processor (CIP) and may further include a storage device such as a memory card, a solid state drive (SSD), a hard disk drive (HDD), a CD-ROM, or the like.

Figure 11:
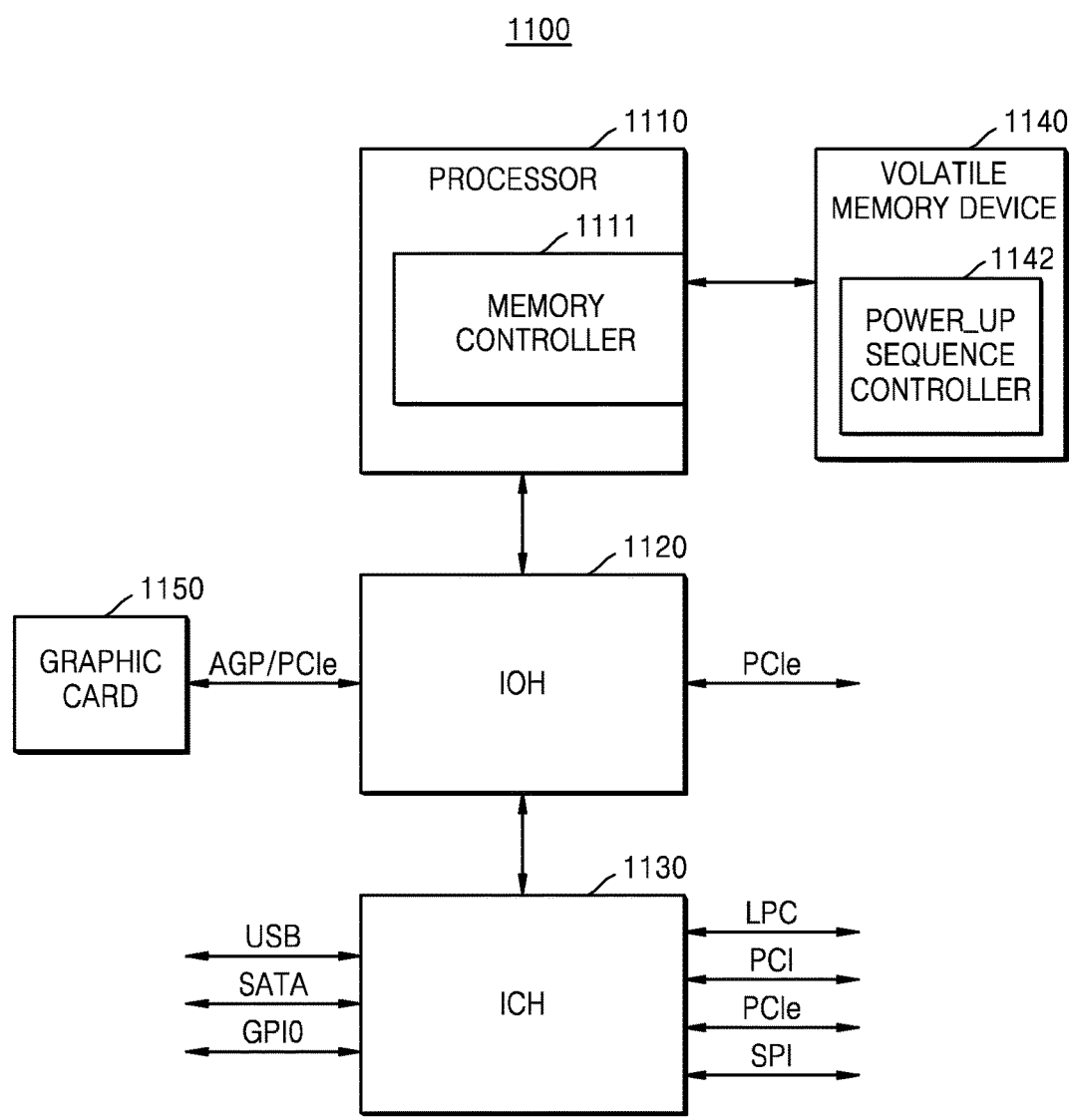
FIG. 11 is a block diagram illustrating an example where a memory device including a power-up sequence controller according to certain exemplary embodiments is applied to a computing system.

FIG. 11 is a block diagram illustrating an example where a memory device including a power-up sequence controller according to embodiments is applied to a computing system 1100.

Referring to FIG. 11, the computing system 1100 may include a processor 1110, an input/output hub (IOH) 1120, an input/output controller hub (ICH) 1130, a memory device 1140, and a graphic card 1150. According to an embodiment, the computing system 1100 may be any type of computing system, such as, for example, a personal computer (PC), a server computer, a workstation, a laptop computer, a mobile phone, a smartphone, a PDA, a PMP, a digital camera, a digital television (TV), a set-top box, a music player, a portable game console, a navigation system, or the like.

The processor 1110 may execute various computing functions such as certain calculations or tasks. For example, the processor 1110 may be a microprocessor or a central processing unit (CPU). According to an embodiment, the processor 1110 may include one processor core or a plurality of processor cores. For example, the processor 1110 may include a dual-core, a quad-core, a hexa-core, and/or the like. Also, the computing system 1100 including one the processor 1110 is illustrated in FIG. 11. In other embodiments, the computing system 1100 may include a plurality of processors. Also, according to other embodiments, the processor 1110 may further include a cache memory disposed inside or outside the processor 1110.

The processor 1110 may include a memory controller 1111 that controls an operation of the memory device 1140. The memory controller 1111 included in the processor 1110 may be, for example, an integrated memory controller (IMC). According to an embodiment, the memory controller 1111 may be disposed in the input/output hub 1120. The input/output hub 1120 including the memory controller 1111 may be referred to as a memory controller hub (MCH).

The memory device 1140 may include a power-up sequence controller 1142 that controls the generation sequences of internal source voltages used by the memory device 1140. The power-up sequence controller 1142 may perform control so that a peak current of a power-up current which is generated according to the internal source voltages generated in powering up the memory device 1140 is equally distributed.

The input/output hub 1120 may manage data transmission between the processor 1110 and devices such as the graphic card 1150 and/or the like. The input/output hub 1120 may be connected to the processor 1110 through various types of interfaces. For example, the input/output hub 1120 may be connected to the processor 1110 through various standard interfaces such as a front side bus (FSB), a system bus, hyper transport, lighting data transport (LDT), quick path interconnect (QPI), a common system interface, peripheral component interface-express (PCIe), and/or the like. In FIG. 11, the computing system 1100 including one input/output hub 1120 is illustrated. However, in other embodiments, the computing system 1100 may include a plurality of input/output hubs.

The input/output hub 1120 may provide various interfaces with devices. For example, the input/output hub 1120 may provide an accelerated graphics port (AGP) interface, PCIe, a communications streaming architecture (CSA) interface, and/or the like.

The graphic card 1150 may be connected to the input/output hub 1120 through AGP or PCIe. The graphic card 1150 may control a display device (not shown) for displaying an image. The graphic card 1150 may include an internal memory device and an internal processor for processing image data. According to an embodiment, the input/output hub 1120 may include a graphic device disposed inside the input/output hub 1120 along with the graphic card 1150 disposed outside the input/output hub 1120 or instead of the graphic card 1150. The graphic device included in the input/output hub 1120 may be referred to as integrated graphics. Also, the input/output hub 1120 including a memory controller and the graphic device may be referred to as a graphics and memory controller hub (GMCH).

The input/output controller hub 1130 may control data buffering and interface enabling various system interfaces to efficiently operate. The input/output controller hub 1130 may be connected to the input/output hub 1120 through an internal bus. For example, the input/output hub 1120 may be connected to the input/output controller hub 1130 through a direct media interface (DMI), a hub interface, an enterprise south bridge interface (ESI), PCIe, and/or the like.

The input/output controller hub 1130 may provide various interfaces with peripheral devices. For example, the input/output controller hub 1130 may provide an USB port, a serial advanced technology attachment (SATA) port, a general-purpose input/output (GPIO), a low pin count (LPC) bus, a serial peripheral interface (SPI), PCI, PCIe, and/or the like.

According to an embodiment, two or more of the processor 1110, the input/output hub 1120, and the input/output controller hub 1130 may be implemented as one chipset.

While the present disclosure has been particularly shown and described with reference to embodiments thereof, it will be understood that various changes in form and details may be made therein without departing from the spirit and scope of the following claims.

What is claimed is:

1. A semiconductor device comprising:
  a first chip comprising:
    a first voltage generator configured to generate a first plurality of internal source voltages including a first internal source voltage having a first voltage value, a second internal source voltage having a second voltage value, and a third internal source voltage having a third voltage value, wherein the first, second, and third voltage values are different from each other, and
    a first power-up sequence controller configured to control a first sequence of generating by the first voltage generator the first internal source voltage, the second internal source voltage, and the third internal source voltage; and
  a second chip comprising:
    a second voltage generator configured to generate a second plurality of internal source voltages including a fourth internal source voltage having the first voltage value, a fifth internal source voltage having the second voltage value, and a sixth internal source voltage having the third voltage value, and
    a second power-up sequence controller configured to control a second sequence of generating by the second voltage generator the fourth internal source voltage, the fifth internal source voltage, and the sixth internal source voltage,
  wherein the first sequence is different from the second sequence.

2. The semiconductor device of claim 1, wherein the first power-up sequence controller comprises a first randomizer circuit configured to control the first sequence in response to a first power stabilization signal of the first chip, and
  wherein the second power-up sequence controller comprises a second randomizer circuit configured to control the second sequence in response to a second power stabilization signal of the second chip.

3. The semiconductor device of claim 2, wherein the first power stabilization signal is generated based on an external source voltage supplied to the first chip, and
  wherein the second power stabilization signal is generated based on the external source voltage supplied to the second chip.

4. The semiconductor device of claim 2, wherein the first power-up sequence controller further comprises a first multiplexer configured to selectively operate the first voltage generator in response to an output of the first randomizer circuit, and
  wherein the second power-up sequence controller further comprises a second multiplexer configured to selectively operate the second voltage generator in response to an output of the second randomizer circuit.

5. The semiconductor device of claim 1, wherein the first sequence is changed when the semiconductor device is powered up, and
  wherein the second sequence is changed when the semiconductor device is powered up.

6. The semiconductor device of claim 1, wherein the first power-up sequence controller comprises a first power-up sequence storage unit configured to store the first sequence, and
  wherein the second power-up sequence controller comprises a second power-up sequence storage unit configured to store the second sequence.

7. The semiconductor device of claim 6, wherein the first power-up sequence storage unit comprises a first anti-fuse array including a plurality of first anti-fuses, and the plurality of first anti-fuses are programmed with the first internal source voltage, the second internal source voltage, and the third internal source voltage based on the first sequence, and
  wherein the second power-up sequence storage unit comprises a second anti-fuse array including a plurality of second anti-fuses, and the plurality of second anti-fuses are programmed with the fourth internal source voltage, the fifth internal source voltage, and the sixth internal source voltage based on the second sequence.

8. The semiconductor device of claim 1, wherein the first power-up sequence controller comprises a first control logic configured to control the first sequence based on power-up sequence information input through a plurality of pads included in the semiconductor device, and
  wherein the second power-up sequence controller comprises a second control logic configured to control the second sequence based on power-up sequence information input through the plurality of pads.

9. The semiconductor device of claim 8, wherein signals of the semiconductor device are not input or output through the plurality of pads.

10. The semiconductor device of claim 1, wherein the semiconductor device is a multi-chip package including the first and second chips which are stacked and are electrically connected to each other through a plurality of through electrodes.

11. The semiconductor device of claim 1, wherein the semiconductor device is a memory module including a plurality of memory chips mounted on a printed circuit board.

12. The semiconductor device of claim 1, wherein the first voltage generator comprises a first power-up voltage generation circuit configured to generate the first internal source voltage, a second power-up voltage generation circuit configured to generate the second internal source voltage, and a third power-up voltage generation circuit configured to generate the third internal source voltage, and
  wherein the second voltage generator comprises a fourth power-up voltage generation circuit configured to generate the fourth internal source voltage, a fifth power-up voltage generation circuit configured to generate the fifth internal source voltage, and a sixth power-up voltage generation circuit configured to generate the sixth internal source voltage.

13. A multi-chip package comprising:
a first memory chip comprising:
a first voltage generator configured to generate a first plurality of internal source voltages having first values, the first values including a first internal source voltage value, a second internal source voltage value, and a third internal source voltage value; and
a first power-up sequence controller configured to control a generation sequence of the first plurality of internal source voltages generated by the first voltage generator;
a second memory chip comprising:
a second voltage generator configured to generate a second plurality of internal source voltages having second values, the second values including the first internal source voltage value, the second internal source voltage value, and the third internal source voltage value; and
a second power-up sequence controller configured to control a generation sequence of the second plurality of internal source voltages generated by the second voltage generator,
wherein the first, second, and third internal source voltage values are different from each other, and
wherein the first power-up sequence controller sets the generation sequence of the first plurality of internal source voltages different from the generation sequence of the second plurality of internal source voltages thereby distributing a peak current of a power-up current in powering up the multi-chip package.

14. The multi-chip package of claim 13, wherein the first power-up sequence controller changes the generation sequence of the first plurality of internal source voltages in response to a power stabilization signal, which is generated according to an external source voltage,
wherein the second power-up sequence controller changes the generation sequence of the second plurality of internal source voltages in response to the power stabilization signal, and
wherein the power stabilization signal is applied to the first and second memory chips.

15. The multi-chip package of claim 13, wherein the first power-up sequence controller stores the generation sequence of the first plurality of internal source voltages, and
wherein the second power-up sequence controller stores the generation sequence of the second plurality of internal source voltages.

16. The multi-chip package of claim 13, wherein the first power-up sequence controller determines the generation sequence of the first plurality of internal source voltages based on power-up sequence information input through a first plurality of pads included in the first memory chip, and
wherein the second power-up sequence controller determines the generation sequence of the second plurality of internal source voltages based on power-up sequence information input through a second plurality of pads included in the second memory chip.

17. The multi-chip package of claim 13, wherein the first voltage generator comprises a first power-up voltage generation circuit configured to generate a first internal source voltage having the first internal source voltage value, a second power-up voltage generation circuit configured to generate a second internal source voltage having the second internal source voltage value, and a third power-up voltage generation circuit configured to generate a third internal source voltage having the third internal source voltage value, and
wherein the second voltage generator comprises a fourth power-up voltage generation circuit configured to generate a fourth internal source voltage having the first internal source voltage value, a fifth power-up voltage generation circuit configured to generate a fifth internal source voltage having the second internal source voltage value, and a sixth power-up voltage generation circuit configured to generate a sixth internal source voltage having the third internal source voltage value.

18. A method for controlling a power-up sequence of a multi-chip package including a first memory chip and a second memory chip, the method comprising:
generating, by a first power-up sequence controller of the first memory chip, a first operational sequence of operation of a first plurality of voltage generation circuits;
transmitting the first operational sequence from the first power-up sequence controller to the first plurality of voltage generation circuits;
generating, by a second power-up sequence controller of the second memory chip, a second operational sequence of operation of a second plurality of voltage generation circuits, the second operational sequence being different from the first operational sequence;
transmitting the second operational sequence from the second power-up sequence controller to the second plurality of voltage generation circuits; and
generating at power-up of the multi-chip package, by each of the first and second pluralities of voltage generation circuits, power-up voltages according to the first and second operational sequences.

19. The method of claim 18, wherein the generating at power-up, by each of the first and second pluralities of voltage generation circuits, the power-up voltages further comprises:
operating the first plurality of voltage generation circuits to generate a first internal source voltage having a first voltage value, a second internal source voltage having a second voltage value, and a third internal source voltage having a third voltage value, wherein the first, second, and third voltage values are different from each other, and
operating the second plurality of voltage generation circuits to generate a fourth internal source voltage having the first voltage value, a fifth internal source voltage having the second voltage value, and a sixth internal source voltage having the third voltage value.

20. The method of claim 18,
wherein the first memory chip and the second memory chip are the same type,
wherein the first power-up sequence controller is configured to provide the first operational sequence of operation of the first plurality of voltage generation circuits in response to at least one of the following:
a first signal received from a source external to the multi-chip package,
a first randomizer circuit of the first memory chip, and
a first programming of the first memory chip, and
wherein the second power-up sequence controller is configured to provide the second operational sequence of operation of the second plurality of voltage generation circuits in response to at least one of the following:

the first signal,
a second randomizer circuit of the second memory chip, and
a second programming of the second memory chip.

* * * * *